(12) United States Patent
Mayder et al.

(10) Patent No.: US 7,541,824 B2
(45) Date of Patent: Jun. 2, 2009

(54) FORCED AIR COOLING OF COMPONENTS ON A PROBECARD

(75) Inventors: Romi Mayder, San Jose, CA (US); John Andberg, Santa Cruz, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 189 days.

(21) Appl. No.: 11/639,010

(22) Filed: Dec. 14, 2006

(65) Prior Publication Data

US 2008/0143364 A1    Jun. 19, 2008

(51) Int. Cl.
*G01R 1/02* (2006.01)

(52) U.S. Cl. .................................. 324/760; 324/754
(58) Field of Classification Search .................. None
See application file for complete search history.

(56) References Cited

U.S. PATENT DOCUMENTS

| 5,198,753 | A | * | 3/1993 | Hamburgen | 324/754 |
| 5,521,523 | A | * | 5/1996 | Kimura et al. | 324/760 |
| 5,834,946 | A | * | 11/1998 | Albrow et al. | 324/760 |

* cited by examiner

*Primary Examiner*—Vinh P Nguyen
(74) *Attorney, Agent, or Firm*—Holland & Hart, LLP

(57) ABSTRACT

A probe card with an air channel over the active components for cooling the active components on the probe card is provided.

7 Claims, 7 Drawing Sheets

FORCED AIR COOLING OF COMPONENTS ON A PROBECARD

BACKGROUND

This invention relates to the field of devices, systems and methods for testing electronic circuits by applying and measuring electrical signals, and more particularly to devices, systems and methods for supporting automated test equipment (ATE). The ensure proper functionality and reliability, manufacturers typically test wafers, memory devices (such as DRAM and Flash) or other integrated circuits (ICs) at various stages of manufacturing and before shipping to customers.

In recent years, device testers have undergone many changes in order to handle tester of denser, faster and higher volumes of devices. Speed and density have increased by multiple orders of magnitude with testers changing to keep up with the devices. However, as speeds increased, signal path length has become a critical issue. Minimizing path length to achieve high speeds has led to miniaturization by a factor of over 1000 in less than five years. As test electronics is forced to ever greater speeds and densities, one major limitation is the removal of the internal heat generated by the tester. In prior generations of automated test equipment, air cooling was sufficient. However, recent generations of machines are too fast and densely packed for air cooling to be practical and water cooling has been employed for many areas of ATE machines.

A typical tester 100 is illustrated in FIG. 1 with a system bay or upright support rack 140, which houses the support devices for the test head 110, a cooling unit, power supplies and controller for the test electronics. Large bundles of electrical cables and cooling water hoses 160 connect the system bay 140 to the test head 110. The test head 110 is a relatively small enclosure that houses all the tester electronics. The actual signal generation and analysis are performed in the test head 110. Attached to the test head 110 is an interface 120, which is an electromechanical assembly that is essentially a very large connector that permits various probe cards 150 to be attached to the test head 110. The probe card 150 contacts a wafer (not shown) under test and makes electrical contact with the metallic pads on the wafer's surface.

As shown in FIGS. 2 and 3, a typical probe card 150 has an array of contacts (not shown) that make temporary electrical contact with the device under test (not shown). Generally these contacts are some type of spring contact that contacts metallic pads on the device. There are many companies manufacturing probe cards, each with different contact construction and design. The common denominator of any probe card to be interfaced with a particular ATE tester, is a set of proprietary contacts 105 that interface the probe card 150 to the test head 110 via proprietary connections 108 on the interface 120 and the overall dimensions of the probe card 150, which are governed by the tester interface 120 geometry and limitations of the device prober (not shown).

As new and cost effective solutions for the ATE industry are developed, functionality is being added to many devices that heretofore were totally passive, necessitating novel approaches to cooling. One problem in the testing of at least one type of Flash memory (NOR) at the wafer level is that the resources of the tester are too expensive to devote entirely to one IC. Therefore, a means of sharing the tester resources among many devices under test is being developed, resulting in a type of multiplexing scheme, in which tester resources are dynamically switched among many die. Due to the timing accuracy required, using current technology, this switching must take place a very short distance from the die. Currently, due to interconnect limitations and signal path considerations, to accomplish this necessitates putting active components on the probe card 150. One can envision many other types of circuits that would be useful to locate on a probe card 150, for timing or precision measuring considerations, etc.

However, one limitation to mounting active circuitry on the probe card 150 is the heat generated by the devices. Some designs using active signal conditioning dissipate substantial amounts of power, so a probe card may dissipate upwards to a half a kilowatt or more. Heat inputs of this magnitude to the interior of the prober cannot be tolerated, so some method of active cooling to remove heat from the probe card 150 is necessary moving forward.

Although many current ATE testers make extensive use of water cooling, this method of cooling the probe card may be problematic. Water blocks are used in ATE testers to which various PCBs are attached in order to transfer heat into the water. One problem with using this method to cool the probe card 150 is due to potential leakage or spillage of the cooling fluid when installing or removing the probe card 150 from the interface 120. Probers (not shown) are made so that a probe card is inserted into the prober, then internal automation (not shown) mates the probe card 150 to the interface 120 and latches it. The electrical connections in present generations of testers are often made using pneumatically activated connectors 108, which occurs after the probe card 150 is latched to the tester interface 120.

A water cooled probe card 150 would need to make and break a connection to the water path using automated quick disconnects. All such fittings leak a slight amount when breaking the connections. This would not be acceptable in the confines of current probers, which are very sensitive mechanical systems that position wafers with accuracies in the micron range. The option of removing the test head 110 from the prober to change probe cards 150 is not feasible, because this is a manual operation. Since probe cards 150 may cost more than one hundred thousand dollars, they are always handled using automation.

Therefore, there is a need to cool electronic devices and active circuit elements on probe cards more reliably than traditional water cooling techniques.

BRIEF DESCRIPTION OF THE DRAWINGS

An understanding of the present teachings can be gained from the following detailed description, taken in conjunction with the accompanying drawings of which.

DETAILED DESCRIPTION

In the following detailed description, for purposes of explanation and not limitation, example embodiments disclosing specific details are set forth in order to provide a thorough understanding of the present teachings. It is apparent to one having ordinary skill in the art with benefit of the present disclosure that other embodiments according to the present teachings that depart from the specific details disclosed herein remain within the scope of the appended claims. Moreover, descriptions of well-known apparatus and methods may be omitted so as to not obscure the description of the example embodiments. Such methods and apparatus are considered within the scope of the present teachings.

Figure 1:
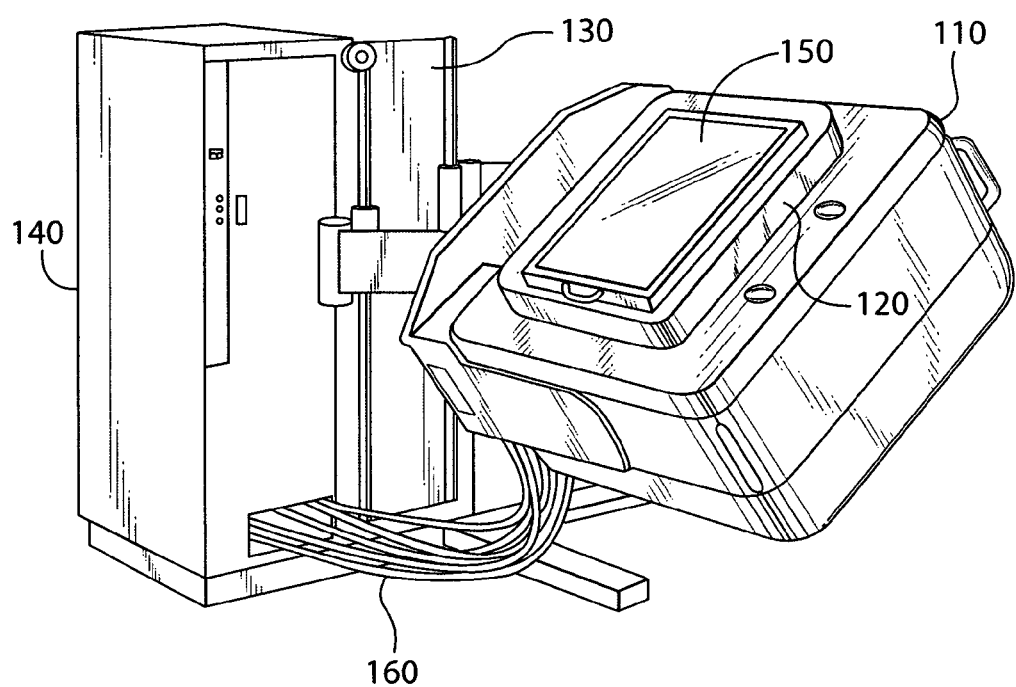
FIG. 1 illustrates a perspective view of a typical wafer tester.
Figure 2:
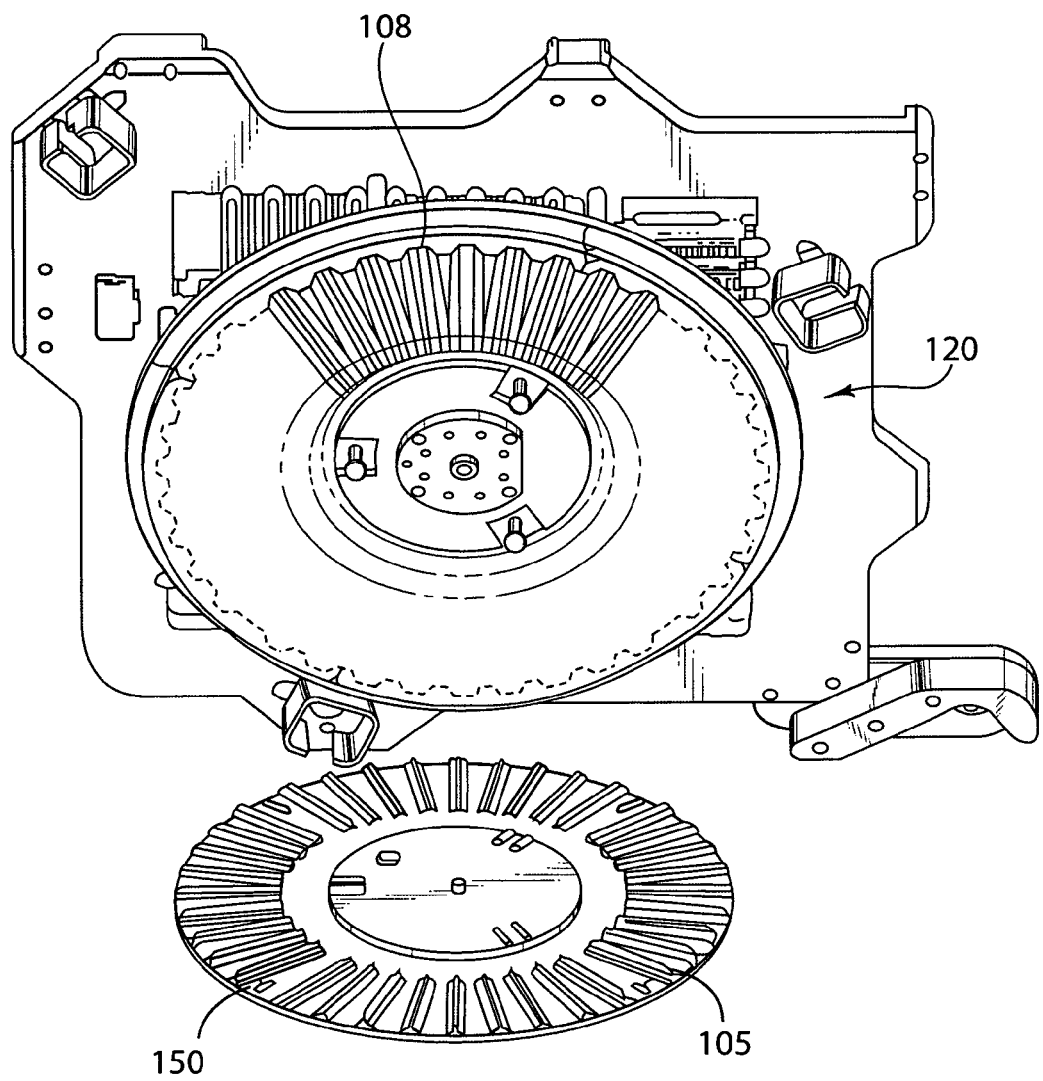
FIG. 2 illustrates a perspective blown-up view of a typical probe card and interface in an unmated position.
Figure 3:
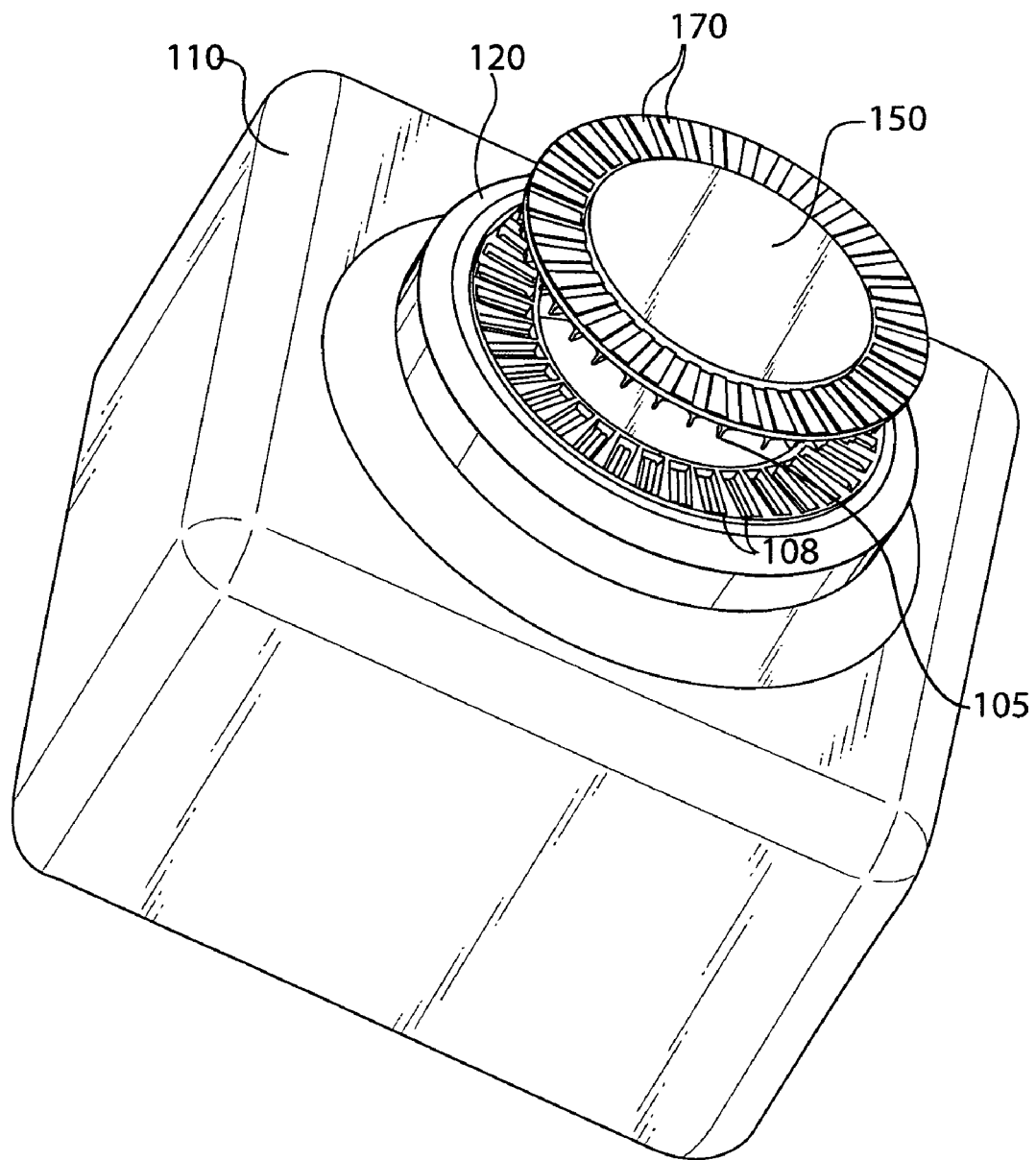
FIG. 3 illustrates a perspective view of a typical probe card and interface on a test head.
Figure 4:
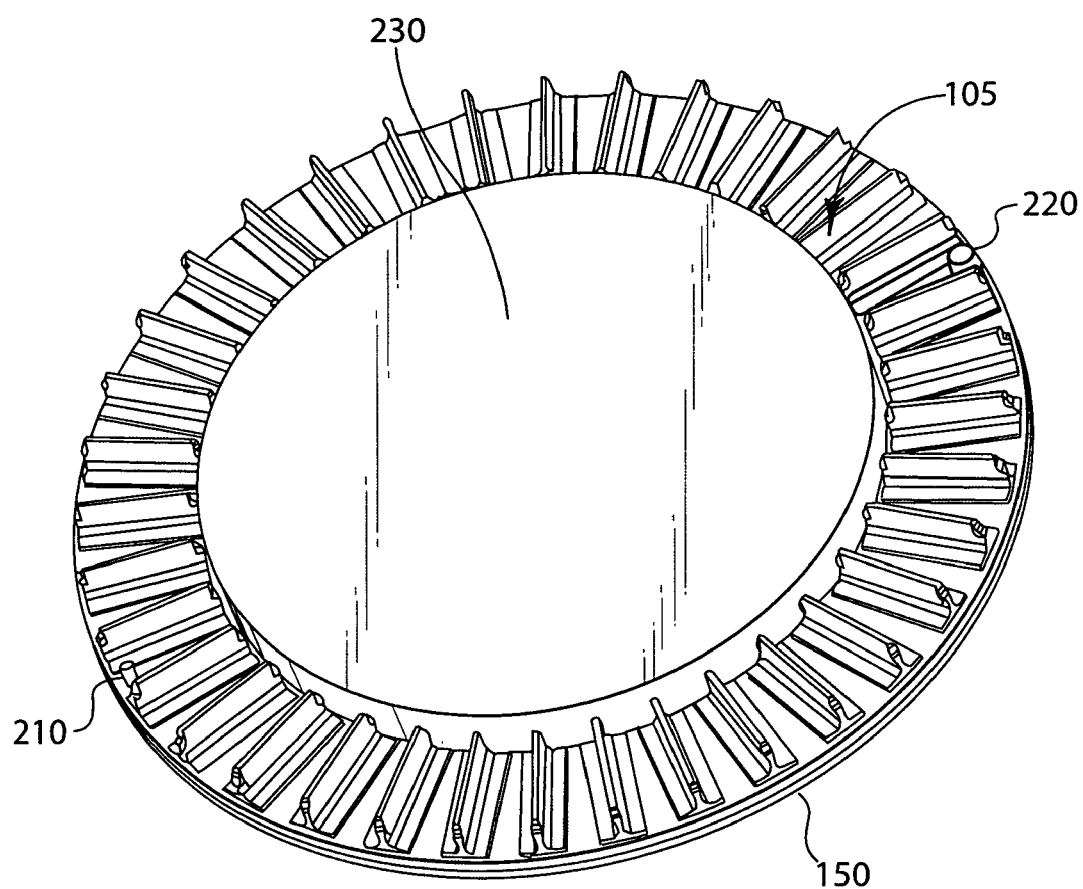
FIG. 4 illustrates a perspective view of the connector side of a probe card according to the present teachings.
Figure 5:
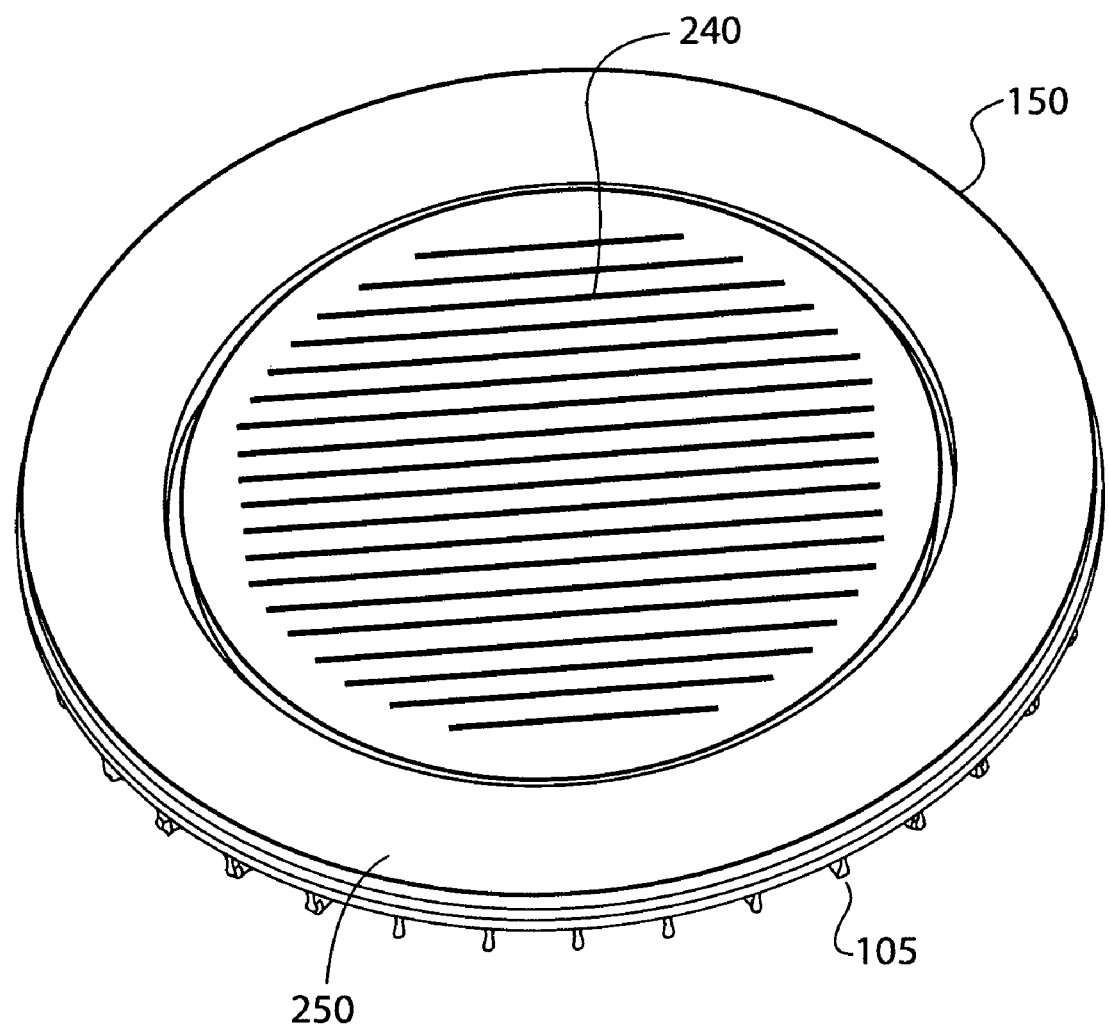
FIG. 5 illustrates a perspective view of the DUT side of a prove card with an air channel for cooling according to the present teachings.
Figure 6:
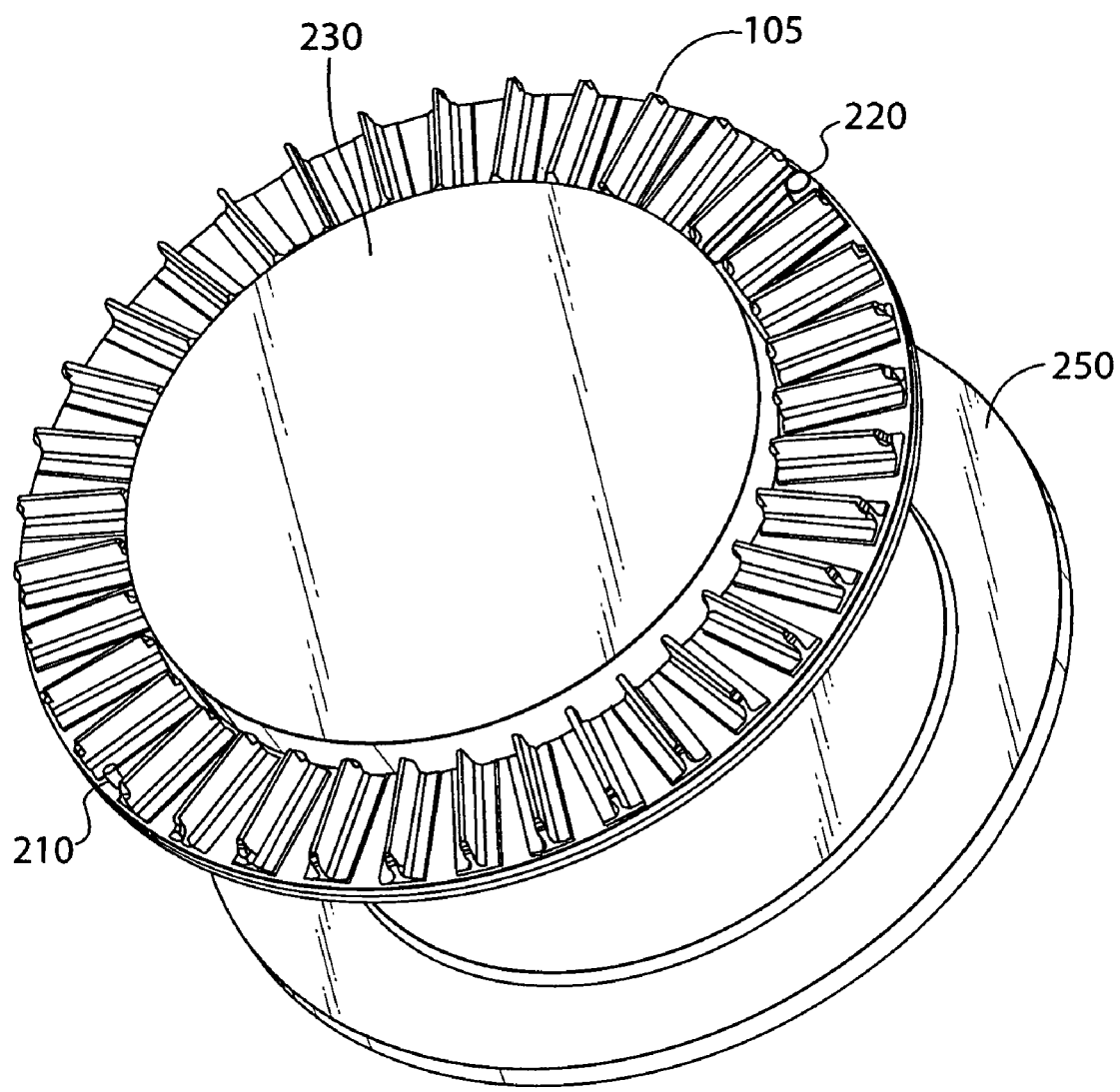
FIG. 6 illustrates a perspective view of the connector side of a probe card with the air channel removed according to the present teachings.
Figure 7:
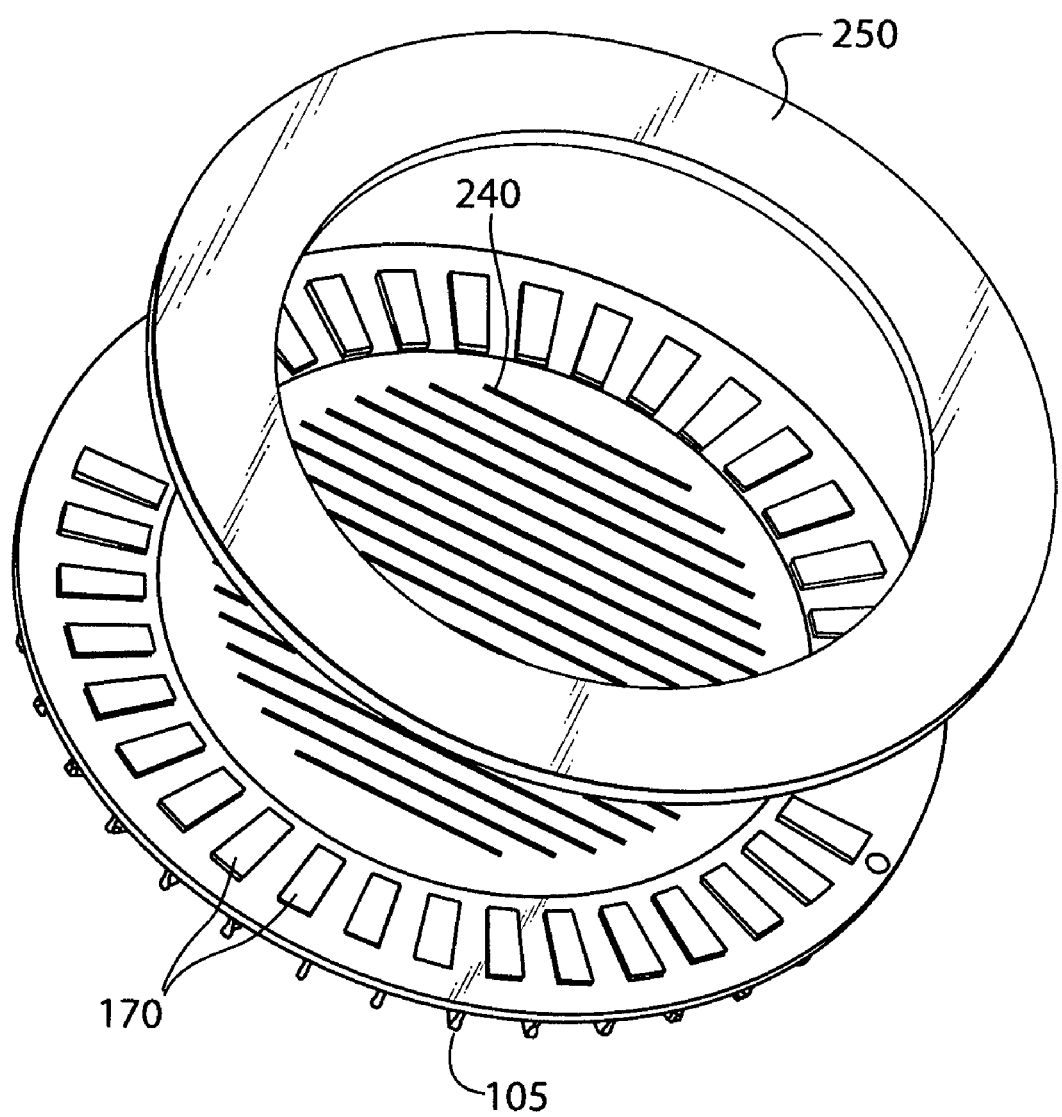
FIG. 7 illustrates a perspective view of the DUT side of a probe card with the air channel removed according to the present teachings.

With specific reference to FIGS. 4 and 5, a probe card 150 with an air channel 250 on the opposite side of the probe card 150 from connectors 105 is shown. FIGS. 6 and 7 show a probe card 150 with an air channel 250 removing. As can be seen in FIGS. 6 and 7, the air channel 250 covers active components and circuitry 170 on the probe card 150. The air channel may also include at least one air inlet 210 and at least one air outlet 220. Probe card 250 may also include a stiffener 230 on one side and test probe contacts 240 on the opposite side from the stiffener.

The present teachings address the problem of cooling components 170 on the probe card 150 by using air confined to a suitable flow channel 250 affixed to the probe card 150. The air channel 250 may have a cross section configuration like a wide inverted "u" shape with suitable sealing against the probe card surface. The sealing of the air channel 250 to the surface of the probe card 150 may be accomplished using sealants, O-rings, die-cut foam seals or any similar sealing means that does not exert enough force between channel attachment points to warp the probe card.

The active components 170 on the probe card 150 are mounted either directly on the probe card surface, or to a PCB or MCM attached thereto. Attached to the probe card 150 over these components 170 is a circular or annular cover or channel 250 having a substantially "u" shaped cross section. The cover or channel 250 serves to confine air to the vicinity of the components 170, as will be appreciated from FIG. 7.

The inlet air 210 for this covered air channel 250 may be accomplished in several manners. In one embodiment, a quick disconnect fitting for pressurized air that is suitable for automated connections is used. In which case, the air used for cooling the components 170 would come from a compressed air supply. The air flow may be regulated and the pressure reduced to atmospheric with a suitable regulator or orifice. Although the air flow velocity in the air channel 250 may be high, its narrow cross section would mean that a relatively small volumetric flow is necessary.

The air may travel directly and rapidly over the components 170 in order to effectively remove heat. The components 170 in the cooling channel 250 may also have heat sinks to improve heat transfer. Also, the underside of the channel may have features to direct the air stream more effectively at high thermal dissipation components. The exhaust air at air outlet 220 of the air channel 250 may be at a lower pressure, and thus less dense, so the air outlet 220 may need to have a larger cross section than the air inlet 210.

The air should not enter the prober, as the heat input and the rapidly moving air may interfere with the prober's operation. Therefore, a suitable passage may be employed back to the test head 110. The interface 120 is the device that connects the tester 110 to the probe card 150. It consists of a mechanical assembly about 6 inches high that contains cables and connectors that mate these two parts. The transition from the probe card channel 250 to the interface 120 may be suitably sealed to prevent egress of air, such as with an O-ring seal.

In another embodiment, the air may be introduced with a blower that is only capable of small pressure rises. In this case, the air inlet 210 would need appreciable area, like the air outlet 220. The system may also be a closed loop, by mounting a heat exchanger and ducting in the interface. It would also be possible to cool the air below ambient with either system, to provide additional cooling.

As will be seen in FIGS. 4-7, the present design places the air channel on the DUT side of the probe card 150, as connectors 105 on the prober interface side of the probe card 150 make most of the space unusable. However, with suitable design, the prober interface side of the probe card 150 could also be used for active circuitry and components and an air channel.

While the invention had been particularly shown and described with reference to specific embodiments, it will be readily appreciated by those skilled in the art that changes in the form and details of the disclosed embodiments may be made without departing from the spirit or scope of the invention. For example, some of the descriptions of embodiments herein imply a certain orientation of various assemblies of which the system is constructed or a certain order of fabricating or mounting the assemblies.

For example, the air channel may have a shape other than annular, depending on the design of the probe card 150 and the location and layout of the active components needing cooling 170. It will be understood, however, that the principles of the present invention may be employed in systems having a variety of spatial orientations or orders of fabrication or mounting and that therefore, the invention should not be limited to the specific orientations or orders of fabrication or mounting disclosed herein.

The invention claimed is:

1. An assembly comprising:
   a probe card, the probe card having a first side and a second side, the first side having a set of contacts thereon for connecting to an interface of a test head;
   at least one component on the second side of the probe card;
   an air channel mounted on the probe card over the at least one component on the second side of the probe card;
   an air intake in communication with the air channel; and
   an air outlet in communication with the air channel;
   wherein the air intake is configured to be coupled in flow communication with an air flow device to provide a flow of air through the air channel causing cooling of the at least one component and a flow of air out the air outlet.

2. An assembly as recited in claim 1 wherein the air outlet is on the first side of the probe card.

3. An assembly as recited in claim 1 wherein the air channel is an annular channel.

4. An assembly as recited in claim 3 wherein the air channel has a substantially U shaped cross section.

5. An assembly as recited in claim 1 wherein the of contacts are provided by interface connectors on the first side of the probe card.

6. An assembly comprising:
   a probe card, the probe card having a first side and a second side, the first side having a set of contacts thereon for connecting to an interface of a test head;

at least one device requiring heat dissipation on the second side of the probe card;

an annular air channel with a U-shaped cross section mounted on the probe card over the at least one device on the second side of the probe card;

an air intake in communication with the air channel; and an air outlet in communication with the air channel;

wherein the air intake is configured to be coupled in flow communication with an air flow device to provide a flow of air through the air channel causing cooling of the at least one component and a flow of air out the air outlet.

7. An assembly as recited in claim 6 wherein the air outlet is on the first side of the probe card.

* * * * *

UNITED STATES PATENT AND TRADEMARK OFFICE
CERTIFICATE OF CORRECTION

| | |
|---|---|
| PATENT NO. | : 7,541,824 B2 |
| APPLICATION NO. | : 11/639010 |
| DATED | : June 2, 2009 |
| INVENTOR(S) | : Romi Mayder and John Andberg |

It is certified that error appears in the above-identified patent and that said Letters Patent is hereby corrected as shown below:

In the claims, claim 5, column 4, line 61 "the of" should read --the set of--.

Signed and Sealed this

Fourth Day of August, 2009

JOHN DOLL
*Acting Director of the United States Patent and Trademark Office*